United States Patent
Kumar et al.

(10) Patent No.: US 7,579,906 B2
(45) Date of Patent: Aug. 25, 2009

(54) SYSTEM AND METHOD FOR PROVIDING A LOW POWER LOW VOLTAGE DATA DETECTION CIRCUIT FOR RF AM SIGNALS IN EPC0 COMPLIANT RFID TAGS

(75) Inventors: Ravi Kumar, Koramangla (IN);
Priyanka Agarwal, Indira Nagar (IN);
V. Pravin Kumar, Ulsoor (IN)

(73) Assignee: National Semiconductor Corporation, Santa Clara, CA (US)

( * ) Notice: Subject to any disclaimer, the term of this patent is extended or adjusted under 35 U.S.C. 154(b) by 305 days.

(21) Appl. No.: 11/044,748

(22) Filed: Jan. 27, 2005

(65) Prior Publication Data

US 2006/0103457 A1     May 18, 2006

Related U.S. Application Data (60) Provisional application No. 60/627,759, filed on Nov. 12, 2004.

(51) Int. Cl.
*H03D 1/04* (2006.01)
(52) U.S. Cl. ........................ 329/364; 329/349

(58) Field of Classification Search ............... 329/347, 329/349–350, 363, 366
See application file for complete search history.

(56) References Cited

U.S. PATENT DOCUMENTS

| | | | | |
|---|---|---|---|---|
| 3,988,679 A * | 10/1976 | Clarke et al. | ................ | 455/306 |
| 5,260,974 A * | 11/1993 | Johnson et al. | ............. | 375/317 |
| 6,426,716 B1 * | 7/2002 | McEwan | ..................... | 342/28 |
| 6,828,853 B2 * | 12/2004 | Rizzo | ......................... | 329/347 |

* cited by examiner

*Primary Examiner*—Robert Pascal
*Assistant Examiner*—James E Goodley (57) ABSTRACT

A system and method is disclosed for demodulating RF amplitude modulated signals in a demodulator circuit of an EPC0 compliant RFID tag. One advantageous embodiment of the invention comprises first and second input ports, a +ve envelope detector circuit for each of the first and second input ports, a −ve envelope detector circuit for each of the first and second input ports, a +ve envelope differentiator circuit, a +ve low pass filter, a −ve envelope differentiator circuit, a −ve low pass filter, and a zero crossing detector. The zero crossing detector detects a transition in the RF input signal using a voltage difference between a +ve filtered differentiated envelope signal and a −ve filtered differentiated envelope signal.

20 Claims, 11 Drawing Sheets

SYSTEM AND METHOD FOR PROVIDING A LOW POWER LOW VOLTAGE DATA DETECTION CIRCUIT FOR RF AM SIGNALS IN EPC0 COMPLIANT RFID TAGS

CROSS REFERENCE TO RELATED APPLICATIONS

This application claims the benefit under 35 U.S.C. § 119 (e) of U.S. Patent Application Ser. No. 60/627,759 filed on Nov. 12, 2004.

TECHNICAL FIELD OF THE INVENTION

The present invention is generally directed to manufacturing technology for semiconductor devices and, in particular, to a system and method for providing a low power low voltage data detection circuit for radio frequency (RF) amplitude modulated (AM) signals in radio frequency identification (RFID) tags.

BACKGROUND OF THE INVENTION

Radio frequency identification (RFID) technology comprises a non-contact automatic identification system. RFID technology provides an automatic method for efficiently collecting product, place, time or transaction data without human intervention.

An RFID system generally comprises a reader unit that uses an antenna to transmit radio energy to interrogate a responder such as a radio frequency identification (RFID) tag. An RFID tag does not have an on-chip battery, but rather receives its energy from the incoming RF signal from the reader unit. The RFID tag uses the energy from the incoming RF signal to extract the data that is stored in the chip of the RFID tag and send the data back to the reader unit. The reader unit can then send the data from the RFID tag to a computer for further processing.

An RFID system usually comprises a reader unit and a plurality of RFID tags. An RFID system can be used to identify persons or objects that have an RFID tag and that are located within the reading range of the reader unit. Using a pre-defined communication protocol the reader unit is capable of communicating with all of the RFID tags that are located within range.

In one embodiment of an RFID system the reader unit transmits data to an RFID tag with an amplitude modulated (AM) radio frequency (RF) signal having a frequency in the range from nine hundred MegaHertz (MHz) to two and four tenths GigaHertz (2.4 GHz). In the RFID tag a demodulator recovers the baseband signal from the incoming RF signal. A demodulator in an RFID tag should be able to recover the baseband signal of an RF amplitude that has sufficient power to power the chip of the RFID tag.

The demodulator in an RFID tag should also be able to decode ASK demodulation depths from twenty percent (20%) to one hundred percent (100%). The demodulator in an RFID tag should also be able to receive data at data rates that range from sixteen thousand bits per second (16 Kbps) to eighty thousand bits per second (80 Kbps) or higher.

Figure 1:
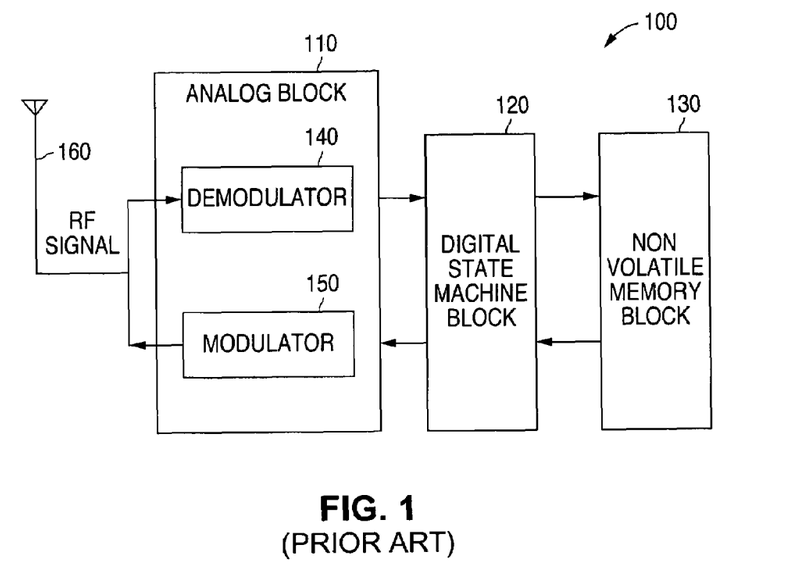
FIG. 1 illustrates a schematic block diagram of an architecture of an exemplary prior art radio frequency identification (RFID) tag.

An RFID tag can be architecturally divided into three major blocks. As shown in FIG. 1, the three major blocks of a prior art RFID tag 100 are an analog block 110, a digital state machine block 120, and a non volatile memory (NVM) block 130. The analog block 110 comprises a demodulator circuit 140 and a modulator circuit 150. Radio frequency (RF) energy couples to the elements of the RFID tag 100 through antenna 160. On-chip direct current (DC) power is generated in RFID tag 100 using a charge pump circuit (not shown in FIG. 1). The DC power is used to power the remaining functions of the chip of RFID tag 100.

Data detection, voltage regulation, backscatter clock generation, and other functions are performed in the analog domain of analog block 110. The actual protocol functions are handled in the digital state machine block 120. EPC data or user data may be stored either in the non volatile memory (NVM) block 130 or in a laser read only memory (ROM) unit (not shown).

The functions of direct current (DC) power generation, clock signal generation, demodulation, etc. are performed using the analog circuitry in the analog block 110. The digital state machine block 120 performs the communication protocol function with the RFID reader unit (not shown).

Figure 2:
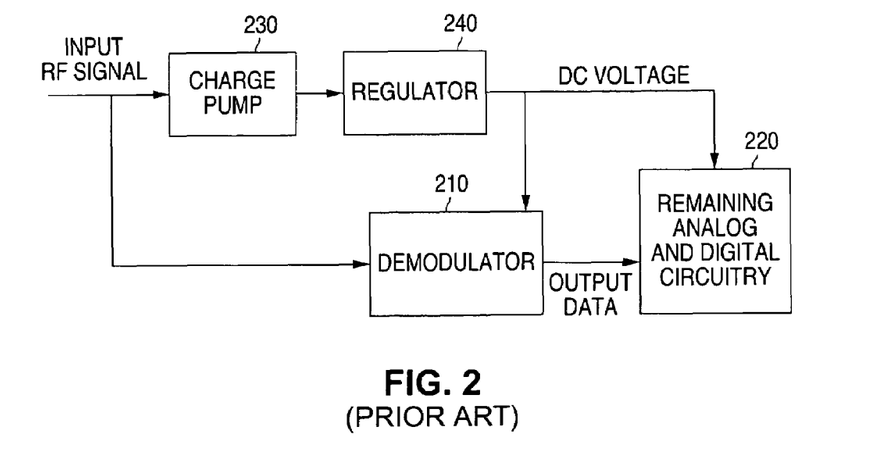
FIG. 2 illustrates a schematic block diagram of a portion of an exemplary prior art radio frequency identification (RFID) tag showing an exemplary demodulator block.

FIG. 2 illustrates a block diagram showing how a prior art demodulator circuit 210 is connected to other portions of the integrated circuit chip of a prior art RFID tag 100. Demodulator 210 and the remaining analog and digital portions 220 of the chip operate with the power supply that is generated by a charge pump circuit 230 and regulated by a regulator circuit 240.

A demodulator circuit 210 of an RFID tag 100 has a wide range of requirements for different regions of operation. For example, the amplitude modulated (AM) signal data rate may be modulated with radio frequency (RF) power levels from minus ten decibels (−10 dBm) to positive twenty decibels (20 dBm) (i.e., from one hundred microwatts (100 μW) to one hundred milliwatts (100 mW). As previously mentioned, the amplitude modulated (AM) signal data rate can vary from sixteen thousand bits per second (16 Kbps) to eighty thousand bits per second (80 Kbps) or higher with a modulation depth that can vary from twenty percent (20%) to one hundred percent (100%). In addition, the rise and fall times of these signals can be between three tenths microsecond (0.3 μs) and ten microseconds (10 μs) depending upon the data rate.

A demodulator circuit 210 of an RFID tag 100 must also not introduce a large delay time during the demodulation process. The demodulator circuit 210 should provide the output of the demodulation process with a delay that is less than one microsecond (1.0 μs).

There is a need in the art for a system and method for providing an improved data detection circuit for radio frequency (RF) signals in radio frequency identification (RFID) tags in RFID systems. There is also a need in the art for a system and method for providing an improved demodulator circuit for use in radio frequency identification (RFID) tags in RFID systems.

SUMMARY OF THE INVENTION

To address the above-discussed deficiencies of the prior art, it is a primary object of the present invention to provide a system and method for providing a low power low voltage data detection circuit for radio frequency (RF) signals in a demodulator circuit of a radio frequency identification (RFID) tag.

In one advantageous embodiment of the present invention a demodulator circuit is provided that comprises a first input port and a second input port. A first port +ve envelope detector circuit and a first port −ve envelope detector circuit are coupled to the first input port. A second port +ve envelope detector circuit and a second port −ve envelope detector circuit are coupled to the second input port.

The second port +ve envelope detector circuit has an output that is coupled to an output of the first port +ve envelope detector circuit. The second port −ve envelope detector circuit has an output that is coupled to an output of the first port −ve envelope detector circuit.

An input of a +ve envelope differentiator circuit is coupled to an output of the first port +ve envelope detector circuit and to an output of the second port +ve envelope detector circuit. An input of a +ve low pass filter is coupled to an output of the +ve envelope differentiator circuit.

An input of a −ve envelope differentiator circuit is coupled to an output of the first port −ve envelope detector circuit and to an output of the second port −ve envelope detector circuit. An input of a −ve low pass filter is coupled to an output of the −ve envelope differentiator circuit.

A first input of a zero crossing detector circuit is coupled to an output of the +ve envelope low pass filter. A second input of the zero crossing detector circuit is coupled to an output of the −ve envelope low pass filter. The zero crossing detector circuit detects a transition in the RF input signal using a voltage difference between a +ve filtered differentiated envelope signal from the +ve envelope low pass filter and a −ve filtered differentiated envelope signal from the −ve envelope low pass filter.

It is an object of the present invention to provide a system and method for demodulating radio frequency (RF) amplitude modulated signals in a demodulator circuit of a radio frequency identification (RFID) tag.

It is also an object of the present invention to provide a system and method for providing a low power low voltage demodulator circuit for use in radio frequency identification (RFID) tags.

It is yet another object of the present invention to provide a system and method for providing a low power low voltage demodulator circuit for use in radio frequency identification (RFID) tags of the type that have more than one input port.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 11, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged demodulator device.

Figure 3:
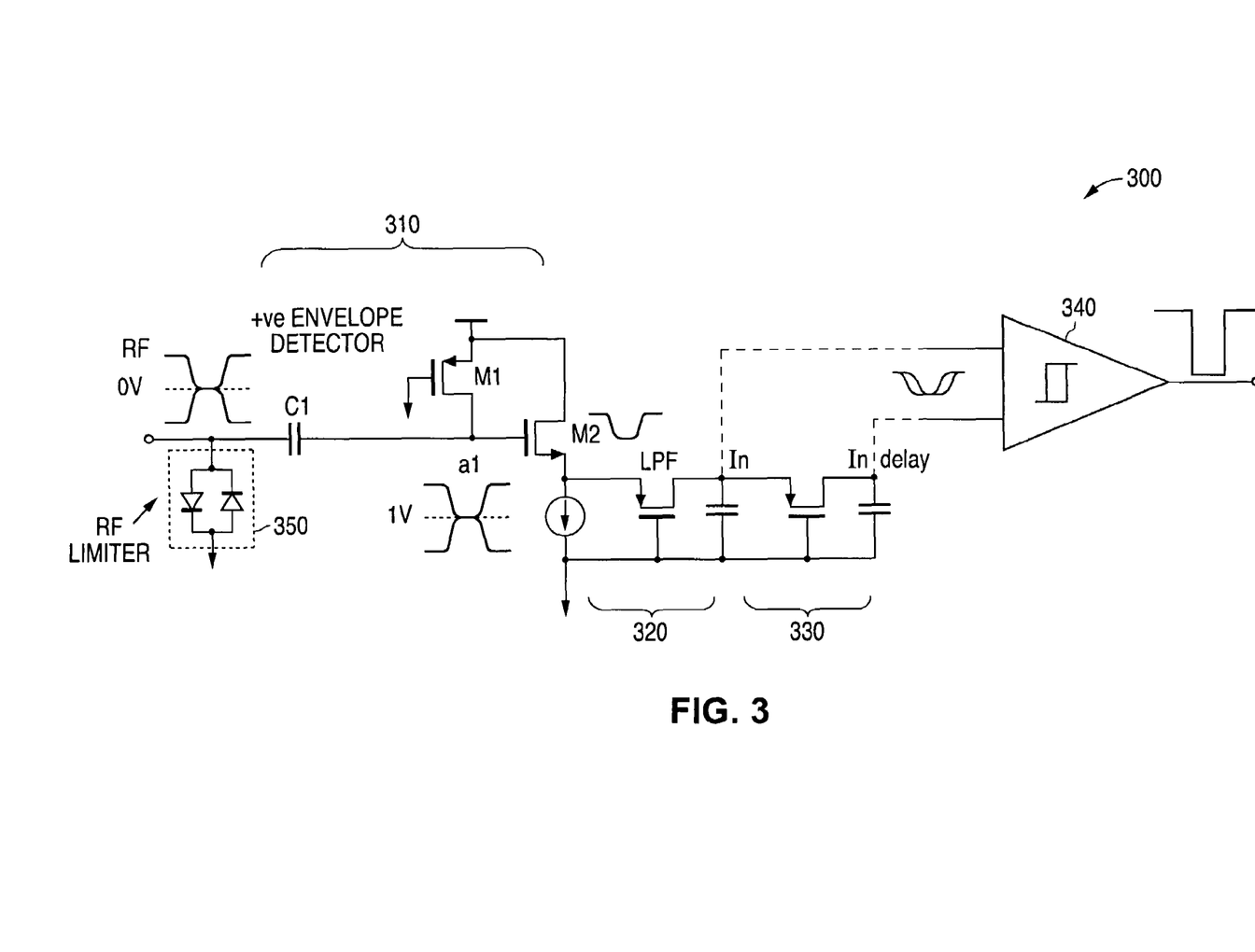
FIG. 3 illustrates a first advantageous embodiment of a demodulator circuit of a radio frequency identification (RFID) tag in accordance with the principles of the present invention.

FIG. 3 illustrates a first advantageous embodiment 300 of a demodulator circuit of a radio frequency identification (RFID) tag in accordance with the principles of the present invention. The demodulator circuit 300 shown in FIG. 3 comprises a +ve envelope detector circuit 310, a first low pass filter 320, a second low pass filter 330, and a latched comparator circuit 340.

The +ve envelope detector circuit 310 detects a first +ve envelope signal of an incoming RF signal and passes the first +ve envelope signal to first low pass filter 320. The output of first low pass filter 320 is provided to a first input of the latched comparator circuit 340. The output of first low pass filter 320 is designated as an "In" signal. The first +ve envelope signal that is output from the first low pass filter 320 (i.e., the "In" signal) is also provided to the second low pass filter 330. The second +ve envelope signal is delayed with respect to the first +ve envelope signal by introducing a small delay with the RC time constant of the second low pass filter 330.

The output of the second low pass filter 330 is provided to a second input of the latched comparator circuit 340. The output of second low pass filter 330 is designated as an "In_delay" signal. The latched comparator circuit 340 compares the "In" signal of the first +ve envelope signal and the "In_delay" signal of the second +ve envelope signal to obtain the logic level output.

To detect the first +ve envelope signal of the incoming RF signal, the incoming RF signal is level shifted to one volt (1 V) and subsequently applied to a source follower. The envelope of the data (with overlapping RF magnitude) is recovered at the source. However, the high frequency components of the signal need to be attenuated further in order to get a cleaner envelope signal. This is why the +ve envelope signal is passed through the first low pass filter 320.

First low pass filter 320 is preferably a first order continuous low pass filter. The cut-off frequency of first low pass filter 320 is preferably chosen to be approximately five hundred thousand Hertz (500 KHz). First low pass filter 320 makes the demodulator circuit 300 immune to signals that may be created by adjacent devices (e.g., the backscatter of the tag itself and the backscatter of the surrounding tags). The characteristics of the second low pass filter 330 are chosen so that the delay that the second low pass filter 330 generates provides sufficient voltage difference for the latched comparator circuit 340 in the worst case (i.e., minimum modulation depth of the RF input).

As previously mentioned, the first +ve envelope signal that is output from first low pass filter 320 is provided to the first input of the latched comparator circuit 340 as an "In" signal. The second +ve envelope signal that is output from second low pass filter 330 is provided to the second input of the latched comparator circuit 340 as an "In_delay" signal. The detection of the transition in the input signal is accomplished by using the voltage difference between the "In" signal and the "In_delay" signal.

It is therefore necessary that the voltage difference between the "In" and "In_delay" signals exceed the hysteresis of the latched comparator circuit 340, even at the minimum input power and modulation depth (i.e., the lowest voltage amplitude). The hysteresis of the latched comparator circuit 340 must overcome the offset voltage of the input differential pair of the operational amplifier. Otherwise, the offset voltage may cause a false detection edge.

If the delay between the "In" signal and the "In_delay" signal is increased in order to increase the voltage difference between the two signals, the total delay from the input to the demodulated output also increases. Therefore, there is a limitation in the operation of demodulator circuit 300 in terms of the practical values of components that may be used in the delay element.

An RF limiter 350 is placed at the input in front of the +ve envelope detector circuit 310. The RF limiter 350 limits the incoming power. This puts an upper limit on the range of input power over which the demodulator circuit 300 has to operate. In addition, at extremely high power levels, the RF limiter 350 makes the modulation depth shallower.

Figure 4:
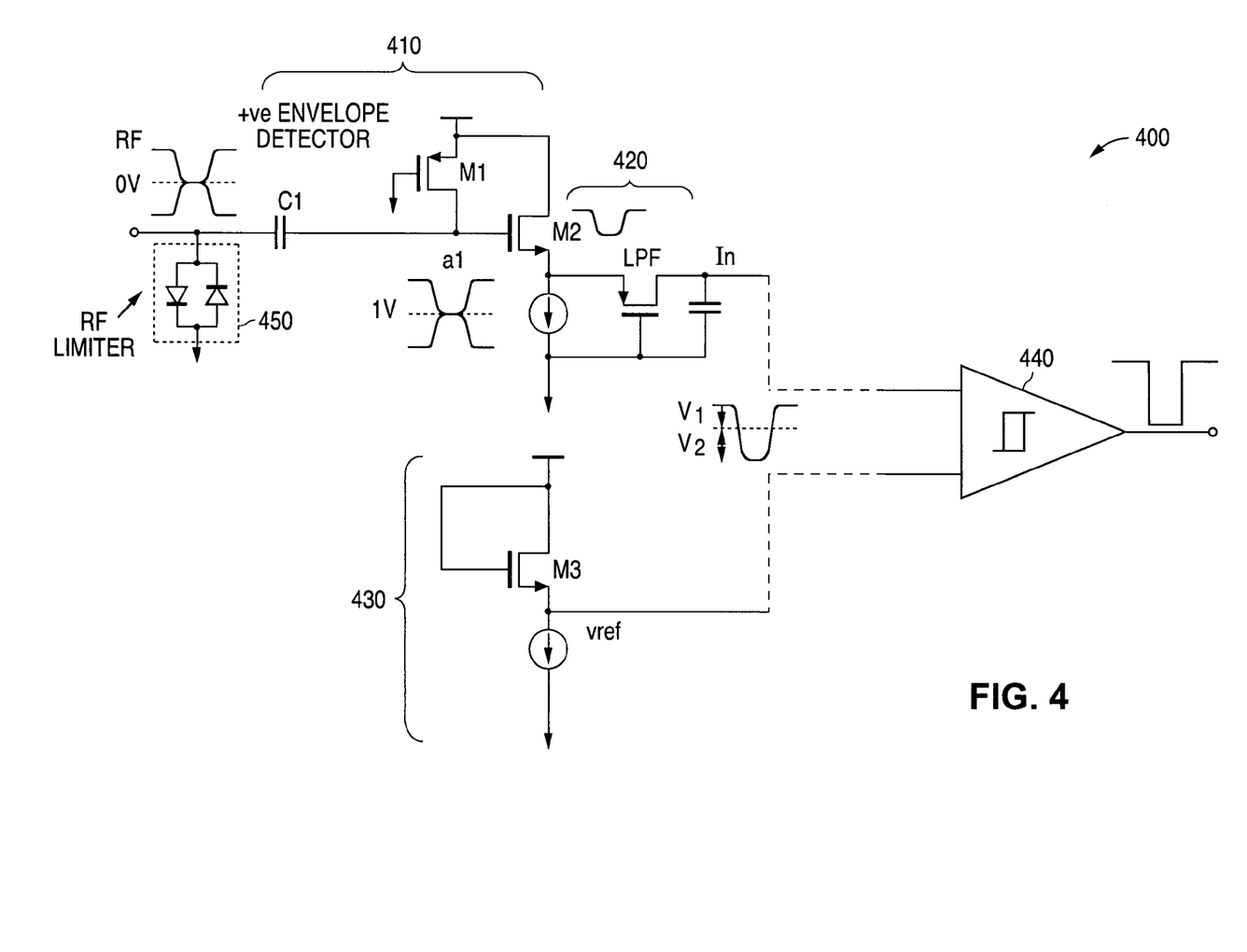
FIG. 4 illustrates a second advantageous embodiment of a demodulator circuit of a radio frequency identification (RFID) tag in accordance with the principles of the present invention.

FIG. 4 illustrates a second advantageous embodiment 400 of a demodulator circuit of a radio frequency identification (RFID) tag in accordance with the principles of the present invention. The demodulator circuit 400 shown in FIG. 4 detects a +ve envelope signal and compares it with a fixed reference voltage level. The demodulator circuit 400 shown in FIG. 4 comprises a +ve envelope detector circuit 410, a low pass filter 420, a reference voltage level unit 430, and a latched comparator circuit 440.

The +ve envelope detector circuit 410 detects a first +ve envelope signal of an incoming RF signal and passes the first +ve envelope signal to low pass filter 420. The output of low pass filter 420 is provided to a first input of the latched comparator circuit 440. The output of low pass filter 420 is designated as an "In" signal.

The output of the reference voltage level unit 430 is provided to a second input of the latched comparator circuit 440. The output of reference voltage level unit 430 is designated as a "vref" signal. The latched comparator circuit 440 compares the "In" signal of the first +ve envelope signal and the "vref" signal to obtain the logic level output.

To detect the first +ve envelope signal of the incoming RF signal, the incoming RF signal is level shifted to one volt (1 V) and subsequently applied to a source follower. The envelope of the data (with overlapping RF magnitude) is recovered at the source. However, the high frequency components of the signal need to be attenuated further in order to get a cleaner envelope signal. This is why the +ve envelope signal is passed through the low pass filter 420.

Low pass filter 420 is preferably a first order continuous low pass filter. The cut-off frequency of low pass filter 420 is preferably chosen to be approximately five hundred thousand Hertz (500 KHz). Low pass filter 420 makes the demodulator circuit 400 immune to signals that may be created by adjacent devices (e.g., the backscatter of the tag itself and the backscatter of the surrounding tags).

As previously mentioned, the first +ve envelope signal that is output from low pass filter 420 is provided to the first input of the latched comparator circuit 440 as an "In" signal. The reference voltage that is output from reference voltage level unit 430 is provided to the second input of the latched comparator circuit 440 as a "vref" signal. The detection of the transition in the input signal is accomplished by using the voltage difference between the "In" signal and the "vref" signal.

The operation of the demodulator circuit 400 shown in FIG. 4 depends upon the voltage level difference between the signal "In" and the signal "vref". The top level and the bottom level of the +ve envelope signal "In" are dependent on the input power and the modulation depth level. Therefore, the design for the proper voltage level for the reference voltage "vref" is critical.

If the value of the reference voltage "vref" is chosen to be very close to the top level of the "In" signal, the voltage difference between the two voltage values "In" and "vref" (designated as "$V_1$") may not be sufficient for the latched comparator circuit 440 to operate. If the value of $V_1$ is increased then the value of $V_2$ decreases significantly. This becomes a problem for situations that involve low power and low modulation. Therefore, the range of the input power and modulation depth over which the demodulator circuit 400 can detect data presents a limitation in the operation of demodulator circuit 400.

An RF limiter 450 is placed at the input in front of the +ve envelope detector circuit 410. The RF limiter 450 limits the incoming power. This puts an upper limit on the range of input power over which the demodulator circuit 400 has to operate. In addition, at extremely high power levels, the RF limiter 450 makes the modulation depth shallower.

Figure 5:
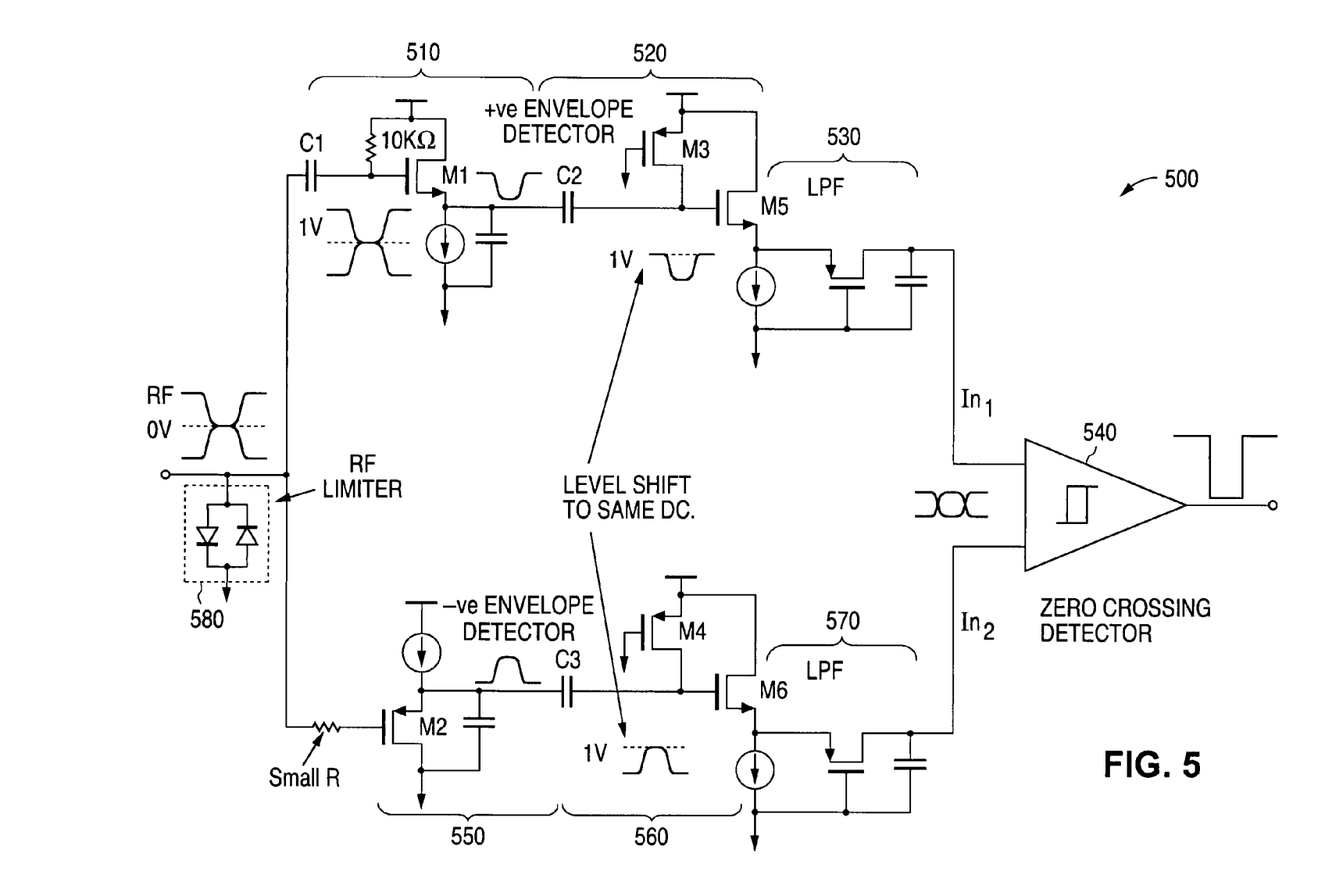
FIG. 5 illustrates a third advantageous embodiment of a demodulator circuit of a radio frequency identification (RFID) tag in accordance with the principles of the present invention.

FIG. 5 illustrates a third advantageous embodiment 500 of a demodulator circuit of a radio frequency identification (RFID) tag in accordance with the principles of the present invention. The demodulator circuit 500 shown in FIG. 5 detects a +ve envelope signal and detects a −ve envelope signal and compares the two envelope signals in a zero crossing detector. The demodulator circuit 500 shown in FIG. 5 comprises a +ve envelope detector circuit 510, a first differentiator circuit 520, a first low pass filter 530, a −ve envelope detector circuit 550, a second differentiator circuit 560, a second low pass filter 570, and a zero crossing detector 540. The amplitude of the +ve envelope signal and the amplitude of the −ve envelope signal are both functions of the power level of the incoming RF signal and the modulation depth.

The +ve envelope detector circuit 510 detects a +ve envelope signal of an incoming RF signal. The +ve envelope detector circuit 510 detects the +ve envelope signal in the same manner as previously described using an NMOS transistor M1. The direct current (DC) level at the source of NMOS transistor M1 is adjusted to avoid clipping at higher power levels. The output of the +ve envelope detector circuit 510 is passed to a first differentiator circuit 520. First differentiator circuit 520 comprises blocking capacitor C2 and PMOS transistor M3. Blocking capacitor C2 blocks the direct current (DC) component of the +ve envelope signal. First differentiator circuit 520 converts the amplitude modulated (AM) signal into a differentiated signal that has edge information.

The +ve differentiated envelope signal is then level shifted down using NMOS transistor M5 and passed through first low pass filter 530. The high frequency components of the signal need to be attenuated further in order to get a cleaner envelope signal. This is why the +ve differentiated envelope signal is passed through the first low pass filter 530. First low pass filter 530 is preferably a first order continuous low pass filter. The cut-off frequency of first low pass filter 530 is preferably chosen to be approximately five hundred thousand Hertz (500 KHz). First low pass filter 530 makes the demodulator circuit 500 immune to signals that may be created by adjacent devices (e.g., the backscatter of the tag itself and the backscatter of the surrounding tags).

The output of first low pass filter 530 is then provided to a first input of the zero crossing detector 540. The output of first low pass filter 530 is designated as an "In$_1$" signal.

At the same time, −ve envelope detector circuit 550 detects a −ve envelope signal of the incoming RF signal. The −ve envelope detector circuit 550 detects the −ve envelope signal using a PMOS transistor M2. The direct current (DC) level at the source of PMOS transistor M2 is adjusted to avoid clipping at higher power levels. A resistor having a value of resistance of approximately two hundred ohms (200 Ω) is connected in series with the gate of PMOS transistor M2 so that an electrostatic storage deflection (ESD) event is localized to ESD devices located in the RF pads.

The output of the −ve envelope detector circuit 550 is passed to a second differentiator circuit 560. Second differentiator circuit 560 comprises blocking capacitor C3 and PMOS transistor M4. Blocking capacitor C3 blocks the direct current (DC) component of the −ve envelope signal. Second differentiator circuit 560 converts the amplitude modulated (AM) signal into a differentiated signal that has edge information.

The −ve differentiated envelope signal is then level shifted down using NMOS transistor M6 and passed through second low pass filter 570. The high frequency components of the signal need to be attenuated further in order to get a cleaner envelope signal. This is why the −ve differentiated envelope signal is passed through the second low pass filter 570. Second low pass filter 570 is preferably a first order continuous low pass filter. The cut-off frequency of second low pass filter 570 is preferably chosen to be approximately five hundred thousand Hertz (500 KHz). Second low pass filter 570 makes the demodulator circuit 500 immune to signals that may be created by adjacent devices (e.g., the backscatter of the tag itself and the backscatter of the surrounding tags).

The output of second low pass filter 570 is then provided to a second input of the zero crossing detector 540. The output of second low pass filter 570 is designated as an "In$_2$" signal. The zero crossing detector 540 compares the "In$_1$" signal of the +ve filtered differentiated envelope signal and the "In$_2$" signal of the −ve filtered differentiated envelope signal to obtain the logic level output.

The zero crossing detector 540 may comprise a simple latch comparator 540. When the two envelope signals are applied to the differential input pair of the comparator, the output makes a transition from high to low or low to high whenever a zero crossing is detected. Because the detection does not involve any fixed reference levels, the detection is insensitive to the RF power levels.

An RF limiter 580 is placed at the input in front of the +ve envelope detector circuit 510 and in front of the −ve envelope detector circuit 550. The RF limiter 580 limits the incoming power. This puts an upper limit on the range of input power over which the demodulator circuit 500 has to operate. In addition, at extremely high power levels, the RF limiter 580 makes the modulation depth shallower.

The hysteresis of the latch of the zero crossing detector 540 is determined by the minimum detection threshold level. In one advantageous embodiment the minimum detection threshold level is twenty percent (20%). The trade off is between the allowed input offset voltage for the input differential pair of the operational amplifier and the hysteresis. The hysteresis is chosen in such a way that the erroneous behavior of the latch can be avoided due to the input offset voltage.

The architecture of the demodulator circuit 500 also avoids the use of a cascoded structure. Therefore demodulator circuit 500 can work for power supply voltages as low as eight tenths of a volt (0.8 V). Efficient low power operation can be achieved by biasing the devices of demodulator circuit 500 in deep subthreshold.

Figure 6:
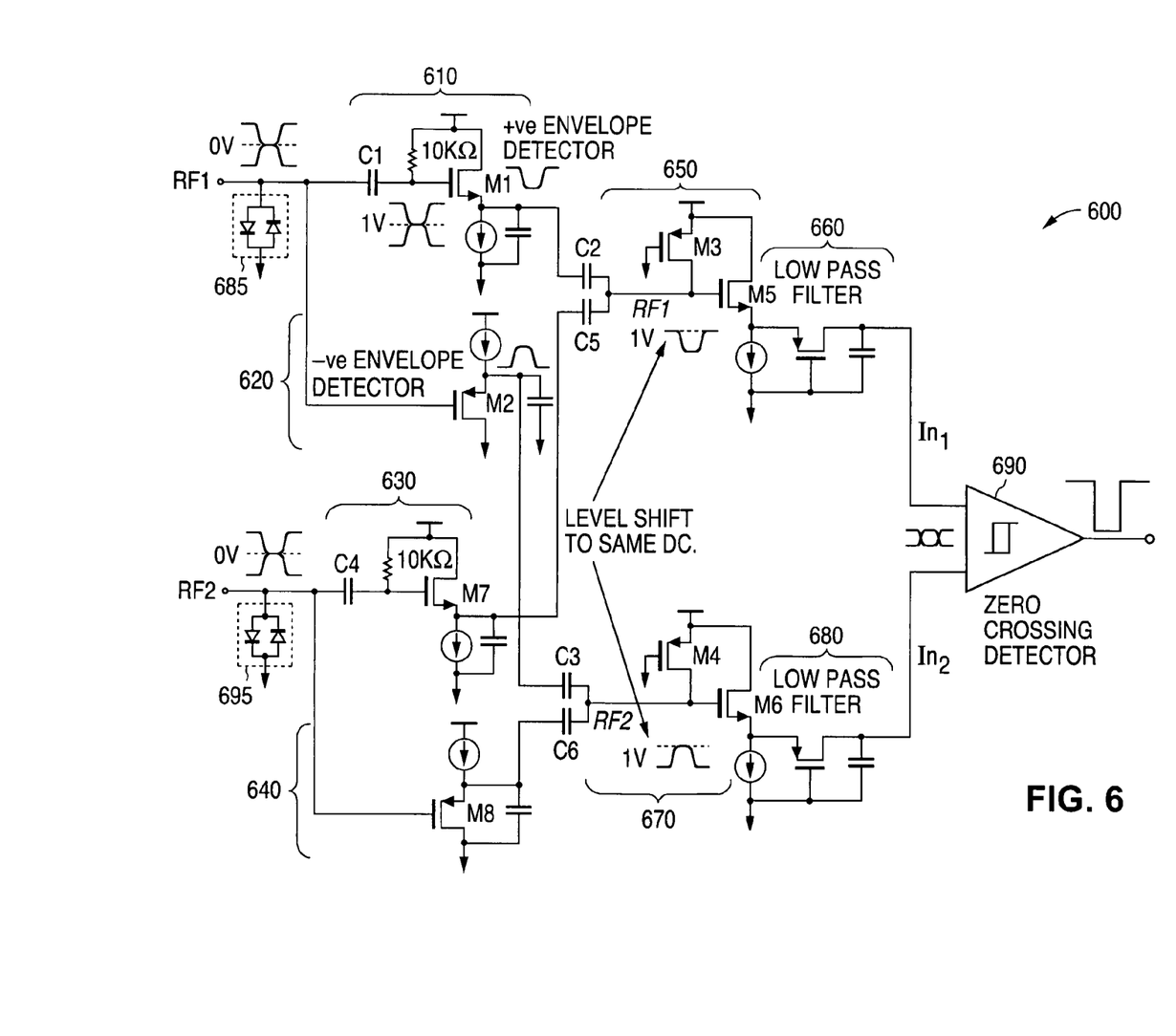
FIG. 6 illustrates a fourth advantageous embodiment of a demodulator circuit of a radio frequency identification (RFID) tag in accordance with the principles of the present invention.

FIG. 6 illustrates a fourth advantageous embodiment 600 of a demodulator circuit of a radio frequency identification (RFID) tag in accordance with the principles of the present invention. In some types of RFID tags there may be more than one independent antenna port. Radio frequency (RF) data may be present at one port or may be simultaneously present at more than one port. Each of the ports feed their own antenna modulator and charge pump.

In order to minimize the hardware (and thus the chip area and the power consumption) the RF signal from the ports can be combined. FIG. 6 illustrates an advantageous embodiment of the demodulator circuit 600 of the present invention designed for use with an RFID tag that has two ports. The first port is designated with an identifier "RF1" and the second port is designated with an identifier "RF2".

The demodulator circuit 600 shown in FIG. 6 detects a +ve envelope signal at each of the two ports (RF1 and RF2) and also detects a −ve envelope signal at each of the two ports (RF1 and RF2). The demodulator circuit 600 combines the +ve envelope signals from the two ports. The demodulator circuit 600 also combines the −ve envelope signals from the two ports. The combined signals are level shifted down using the same level shifter circuitry as in the single port implementation shown in FIG. 5. The level shifted signals are subsequently passed to a zero crossing detector in order to determine the demodulator output.

The demodulator circuit 600 shown in FIG. 6 comprises a first port +ve envelope detector circuit 610, a first port −ve envelope detector circuit 620, a second port +ve envelope detector circuit 630, a second port −ve envelope detector circuit 640, a +ve envelope differentiator circuit 650, a +ve envelope low pass filter 660, a −ve envelope differentiator circuit 670, a −ve envelope low pass filter 680, and a zero crossing detector 690. The amplitude of the +ve envelope signal and the amplitude of the −ve envelope signal are both functions of the power level of the incoming RF signal and the modulation depth.

The first port +ve envelope detector circuit 610 detects a +ve envelope signal of an incoming RF signal. The second port +ve envelope detector circuit 630 also detects the +ve envelope signal. The direct current (DC) level at the source of NMOS transistor M1 of first port +ve envelope detector circuit 610 and the direct current (DC) level at the source of NMOS transistor M7 of the second port +ve envelope detector circuit 630 are adjusted to avoid clipping at higher power levels.

The output of the first port +ve envelope detector circuit 610 is passed to the +ve envelope differentiator circuit 650. The output of the second port +ve envelope detector circuit 630 is passed to the +ve envelope differentiator circuit 650. The +ve envelope differentiator circuit 650 comprises blocking capacitor C2, blocking capacitor C5, and PMOS transistor M3. Blocking capacitor C2 blocks the direct current (DC) component of the +ve envelope signal from the first port +ve envelope detector circuit 610. Blocking capacitor C5 blocks the direct current (DC) component of the +ve envelope signal from the second port +ve envelope detector circuit 630. The +ve envelope differentiator circuit 650 converts the amplitude modulated (AM) signal into a differentiated signal that has edge information.

The combined +ve envelope signal is then level shifted down using NMOS transistor M5 and passed through +ve envelope low pass filter 660. The output of +ve envelope low pass filter 660 is then provided to a first input of the zero crossing detector 690. The output of +ve envelope low pass filter 660 is designated as an "In$_1$" signal.

The first port −ve envelope detector circuit 620 detects a −ve envelope signal of an incoming RF signal. The second port −ve envelope detector circuit 640 also detects the −ve envelope signal. The direct current (DC) level at the source of PMOS transistor M2 of first port −ve envelope detector circuit 620 and the direct current (DC) level at the source of PMOS transistor M8 of the second port −ve envelope detector circuit 640 are adjusted to avoid clipping at higher power levels.

The output of the first port −ve envelope detector circuit 620 is passed to the −ve envelope differentiator circuit 670. The output of the second port −ve envelope detector circuit 640 is passed to the −ve envelope differentiator circuit 670. The −ve envelope differentiator circuit 670 comprises blocking capacitor C3, blocking capacitor C6, and PMOS transistor M4. Blocking capacitor C3 blocks the direct current (DC) component of the −ve envelope signal from the first port −ve envelope detector circuit 620. Blocking capacitor C6 blocks the direct current (DC) component of the −ve envelope signal from the second port −ve envelope detector circuit 640. The −ve envelope differentiator circuit 670 converts the amplitude modulated (AM) signal into a differentiated signal that has edge information.

The combined −ve envelope signal is then level shifted down using NMOS transistor M6 and passed through −ve envelope low pass filter 680. The output of −ve envelope low pass filter 680 is then provided to a second input of the zero crossing detector 690. The output of −ve envelope low pass filter 680 is designated as an "In$_2$" signal. The zero crossing detector 690 compares the "In$_1$" signal of the +ve envelope signal and the "In$_2$" signal of the −ve envelope signal to obtain the logic level output.

An RF limiter 685 is placed at the input in front of the first port +ve envelope detector circuit 610 and in front of the first port −ve envelope detector circuit 620. An RF limiter 695 is placed at the input in front of the second port +ve envelope detector circuit 630 and in front of the second port −ve envelope detector circuit 640. RF limiters 685 and 695 limit the incoming power. This puts an upper limit on the range of input power over which the demodulator circuit 600 has to operate. In addition, at extremely high power levels, the RF limiters 685 and 695 make the modulation depth shallower.

Demodulator circuit 600 illustrates how the principles of the present invention may be utilized in an RFID tag that has two input ports. The present invention may similarly be used in RFID tags that have more than two input ports.

According to presently existing EPC0 standards an RFID tag must be initially reset before the RFID tag starts communicating with a reader unit. The reset process is done by supplying a "data high" signal for a specified period of time at the start of the communication between the RFID tag and the reader unit. If the demodulator circuit is not initialized to a "data high" state the demodulator circuit might start with any data state, either "high" or "low" according to the operating conditions. This may result in the demodulator circuit missing the first edge of data.

In addition, during the reset procedure initiated by the reader unit, if the RFID tag is not initialized, the absence of initialization might cause a change in the data during the reset procedure due to the settling behavior of the demodulator circuit. This will cause the digital state machine to operate incorrectly. In order to avoid this problem, the demodulator circuit has to be initialized to a "data high" state at the start of the operation of the RFID tag.

In the present invention the initialization process is accomplished at the second stage of level shifting within the demodulator circuit. For example, consider the initialization of the operation of demodulator circuit 600. The node after blocking capacitor C2 is pulled to the power supply voltage (VDD) when the RFID tag starts receiving the RF signal from the reader unit. After the initial condition is set, this pull-up operation is disabled.

Because a strong pull-up is used at the +ve envelope detector, the node after blocking capacitor C2 goes high before the −ve envelope detector goes to the same DC level. The latch for the +ve envelope detector acts and this value is latched on. The hysteresis in the zero crossing detector 690 helps to latch on to the same output when the −ve envelope also reaches the same DC level when there is no data in the RF signal.

FIGS. 7A through 7D illustrates four timing diagrams that illustrate the operation of the demodulator circuit of the present invention. The four timing diagrams are from a computer simulation of the operation of an RFID tag comprising demodulator circuit 500. The simulated demodulator circuit operates at a nominal voltage of one volt (1 V) and dissipates approximately five hundred nanowatts (500 nW) of power in an 0.18 μm CMOS technology. The simulated incoming RF signal has a data rate of eighty thousand bits per second (80 Kbps) and a modulation depth of thirty percent (30%). The silicon area of the simulated demodulator circuit is approximately seventy five microns (75 μm) by one hundred sixty microns (160 μm).

Figure 7A:
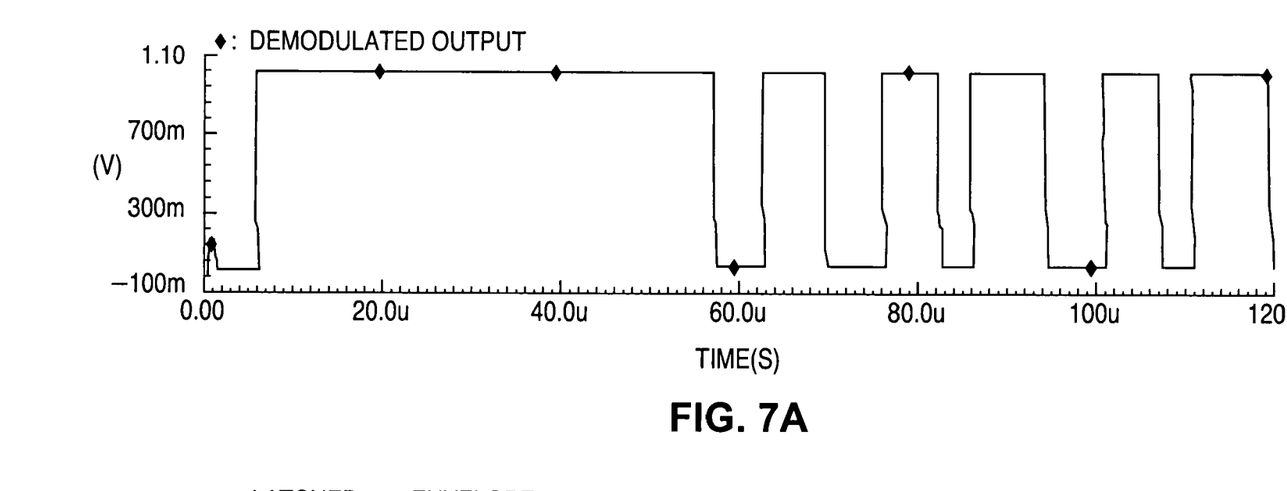
FIG. 7A illustrates a graph of a simulated logic level demodulated output voltage of a demodulator circuit operated in accordance with the principles of the present invention.
Figure 7B:
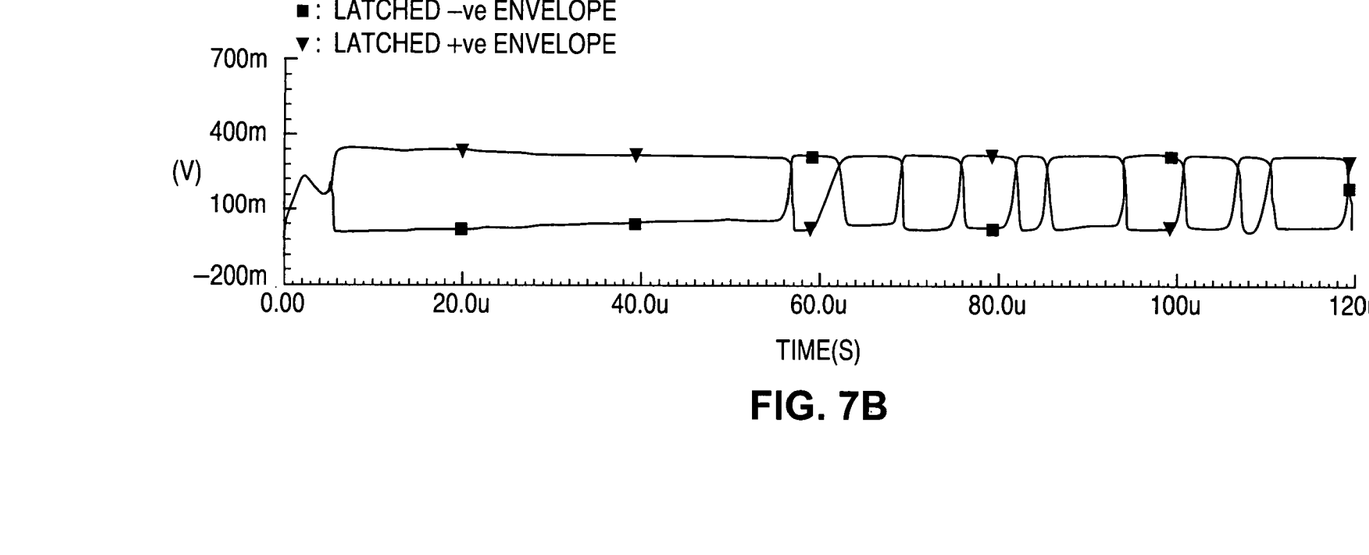
FIG. 7B illustrates a graph of a simulated latched −ve envelope and a simulated latched +ve envelope of a demodulator circuit operated in accordance with the principles of the present invention.
Figure 7C:
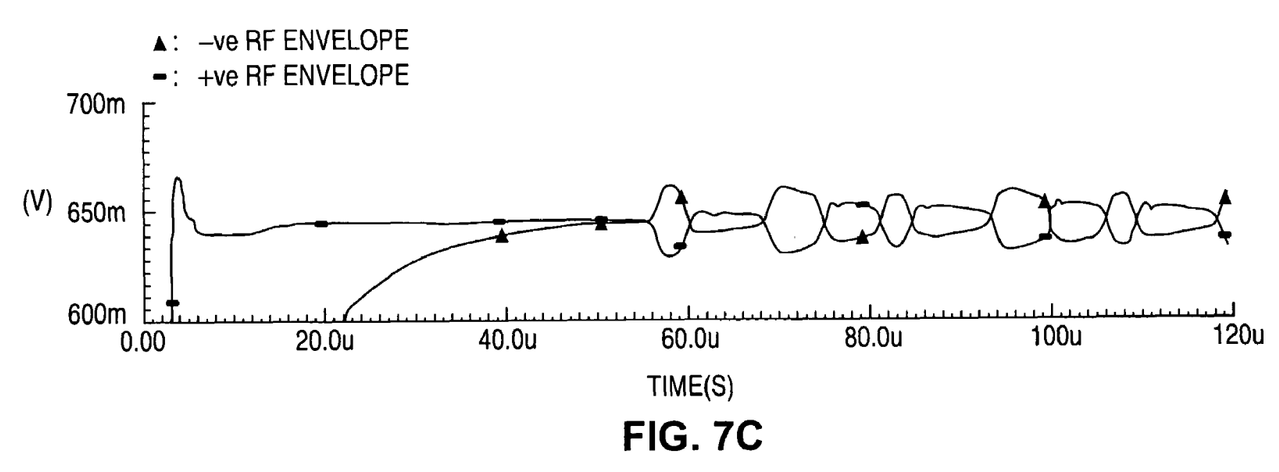
FIG. 7C illustrates a graph of a simulated −ve RF envelope and a simulated +ve RF envelope of a demodulator circuit operated in accordance with the principles of the present invention.
Figure 7D:
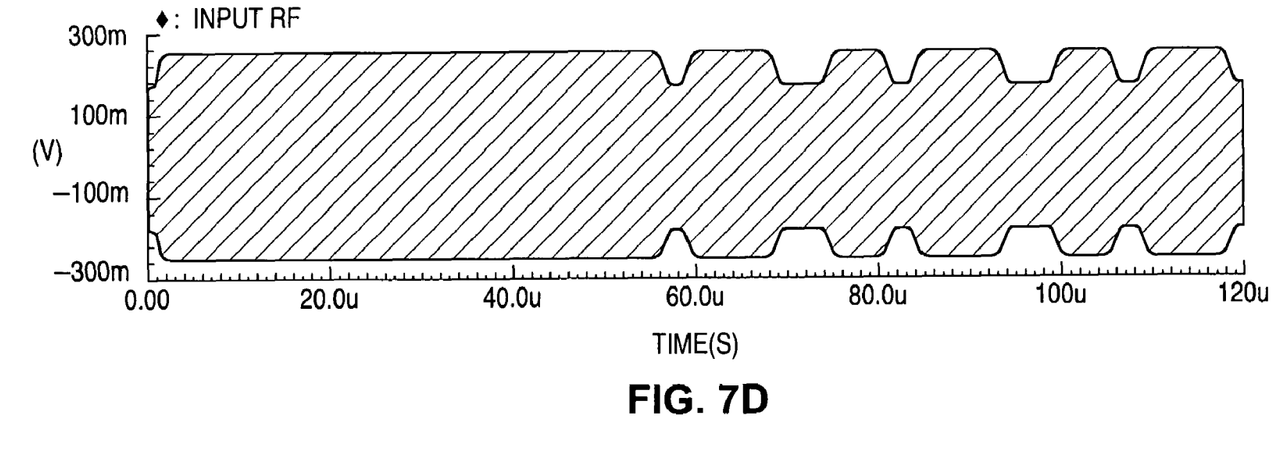
FIG. 7D illustrates a graph of a simulated input RF signal for a demodulator circuit operated in accordance with the principles of the present invention.

The first timing diagram shown in FIG. 7A shows the logic level demodulator output voltage as a function of time. The second timing diagram shown in FIG. 7B shows the voltage as a function of time of the latched +ve envelope and the latched −ve envelope (the latched comparator outputs). The third timing diagram shown in FIG. 7C shows the voltage as a function of time of the +ve RF envelope and the −ve RF envelope (after the level shifters). The fourth timing diagram shown in FIG. 7D shows the voltage of the input RF signal over time.

Figure 8:
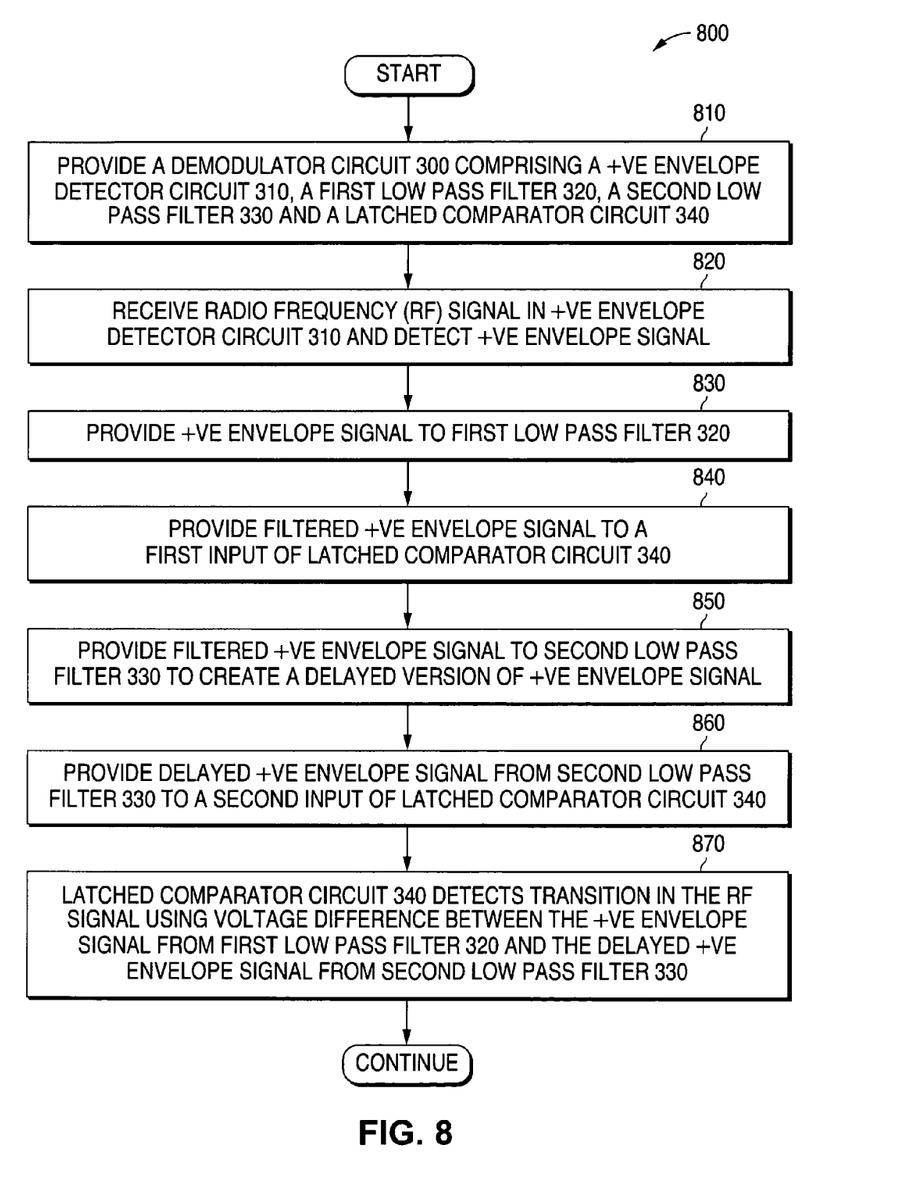
FIG. 8 illustrates a flow chart showing the steps of a first advantageous embodiment of the method of the present invention.

FIG. 8 illustrates a flow chart showing the steps 800 of a first advantageous embodiment of the method of the present invention. A demodulator circuit 300 is provided that comprises a +ve envelope detector circuit 310, a first low pass filter 320, a second low pass filter 330 and a latched comparator circuit 340 (step 810). Then a radio frequency (RF) signal is received in the +ve envelope detector circuit 310 and a +ve envelope signal is detected (step 820). The +ve envelope signal is then provided to the first low pass filter 320 (step 830). The +ve filtered envelope signal from the first low pass filter 320 is provided to a first input of the latched comparator circuit 340 (step 840).

The +ve filtered envelope signal from the first low pass filter 320 is also provided to the second low pass filter 330 to create a delayed version of the +ve filtered envelope signal (step 850). The delayed +ve filtered envelope signal from the second low pass filter 330 is then provided to a second input of the latched comparator circuit 340 (step 860). The latched comparator circuit 340 detects a transition in the RF signal using the voltage difference between the +ve filtered envelope signal from the first low pass filter 320 and the delayed +ve filtered envelope signal from the second low pass filter 330.

Figure 9:
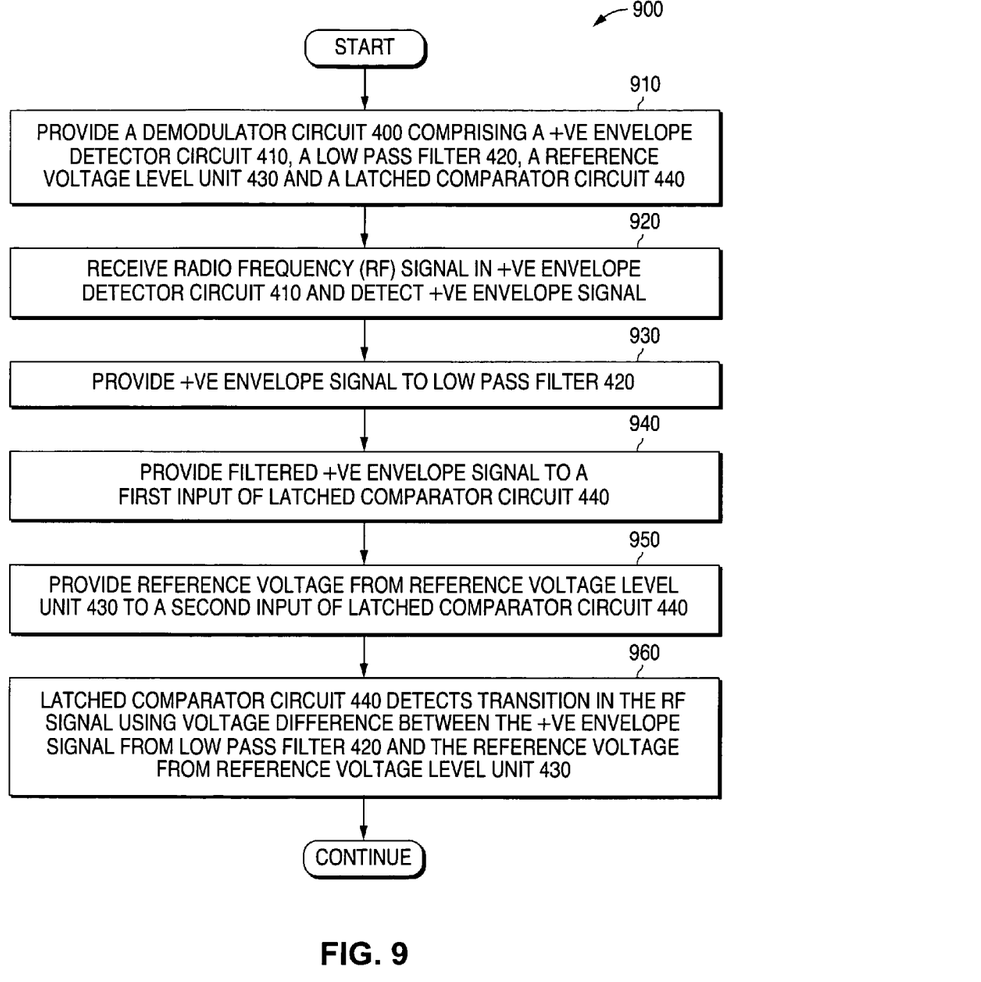
FIG. 9 illustrates a flow chart showing the steps of a second advantageous embodiment of the method of the present invention.

FIG. 9 illustrates a flow chart showing the steps 900 of a second advantageous embodiment of the method of the present invention. A demodulator circuit 400 is provided that comprises a +ve envelope detector circuit 410, a low pass filter 420, a reference voltage level unit 430 and a latched comparator circuit 440 (step 910). Then a radio frequency (RF) signal is received in the +ve envelope detector circuit 410 and a +ve envelope signal is detected (step 920). The +ve envelope signal is then provided to the low pass filter 420 (step 930). The +ve filtered envelope signal from the low pass filter 420 is provided to a first input of the latched comparator circuit 440 (step 940).

A reference voltage from the reference voltage level unit 430 is then provided to a second input of the latched comparator circuit 440 (step 950). The latched comparator circuit 440 detects a transition in the RF signal using the voltage difference between the +ve filtered envelope signal from the low pass filter 420 and the reference voltage from the reference voltage level unit 430.

Figure 10:
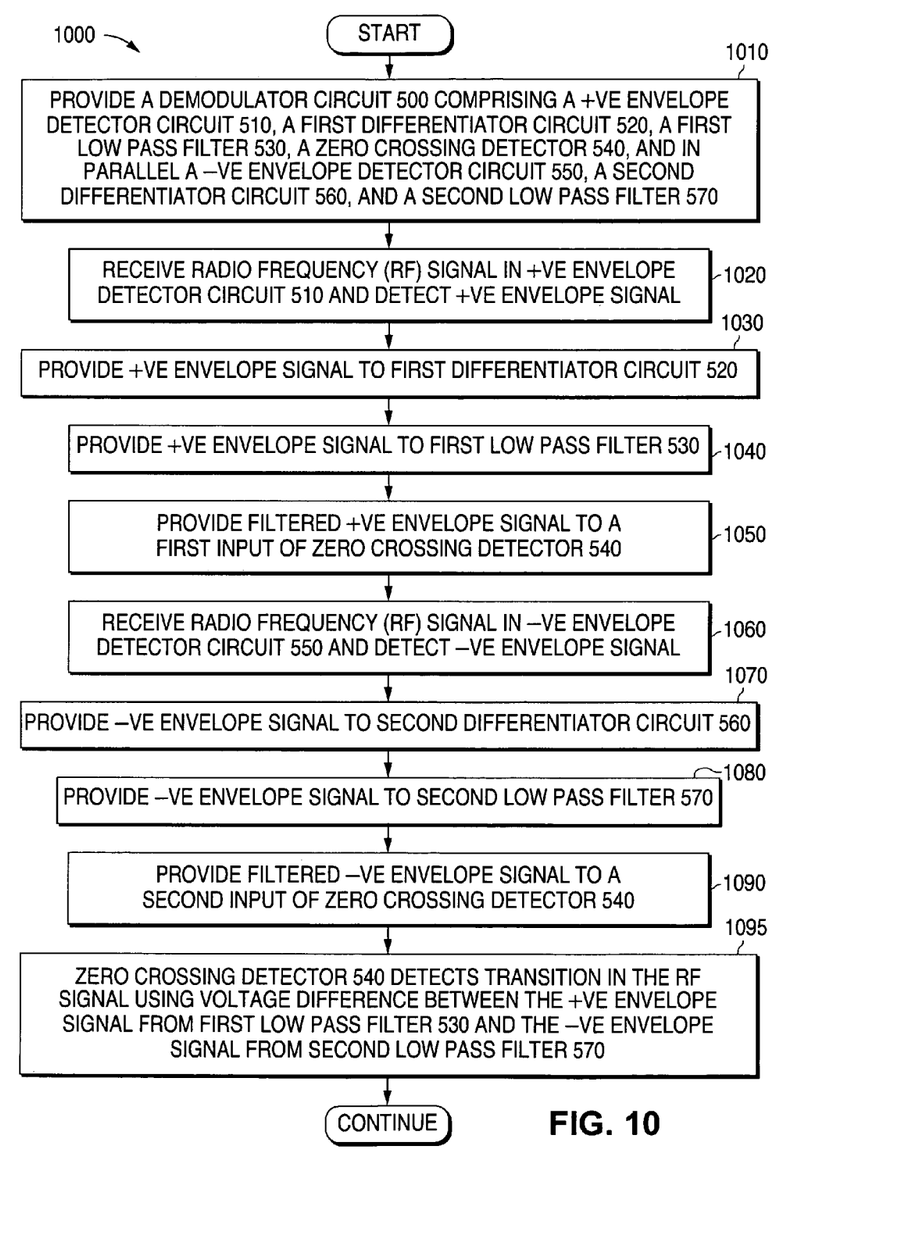
FIG. 10 illustrates a flow chart showing the steps of a third advantageous embodiment of the method of the present invention.

FIG. 10 illustrates a flow chart showing the steps 1000 of a third advantageous embodiment of the method of the present invention. A demodulator circuit 500 is provided that comprises a +ve envelope detector circuit 510, a first differentiator circuit 520, a first low pass filter 530, a zero crossing detector 540, and coupled in parallel, a −ve envelope detector circuit 550, a second differentiator circuit 560, and a second low pass filter 570 (step 1010). A radio frequency (RF) signal is received in the +ve envelope detector circuit 510 and a +ve envelope signal is detected (step 1020). The +ve envelope signal is then provided to the first differentiator circuit 520 (step 1030). Then the output of the first differentiator circuit 520 is provided to first low pass filter 530 (step 1040). The filtered differentiated output signal from the first low pass filter 530 is provided to a first input of the zero crossing detector 540 (step 1050).

A radio frequency (RF) signal is received in the −ve envelope detector circuit 550 and a −ve envelope signal is detected (step 1060). The −ve envelope signal is then provided to the second differentiator circuit 560 (step 1070). Then the output of the second differentiator circuit 560 is provided to second low pass filter 570 (step 1080). The filtered differentiated output signal from the second low pass filter 570 is provided to a second input of the zero crossing detector 540 (step 1090).

The zero crossing detector 540 detects a transition in the RF signal using the voltage difference between the +ve filtered differentiated envelope signal from the first low pass filter 530 and the −ve filtered differentiated envelope signal from the second low pass filter 570 (step 1095).

Figure 11:
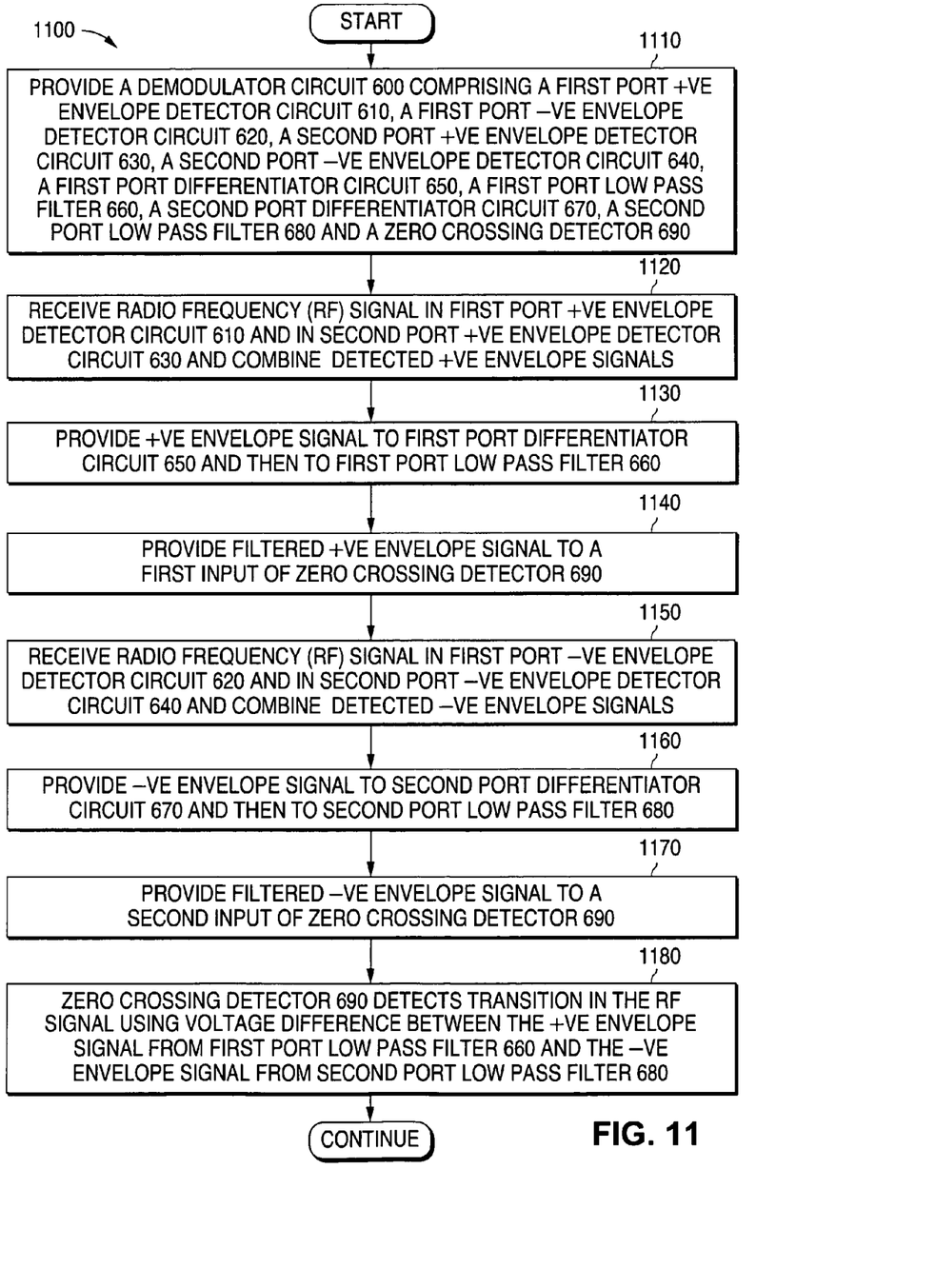
FIG. 11 illustrates a flow chart showing the steps of a fourth advantageous embodiment of the method of the present invention.

FIG. 11 illustrates a flow chart showing the steps 1100 of a fourth advantageous embodiment of the method of the present invention. A demodulator circuit 600 is provided that comprises a first port +ve envelope detector circuit 610, a first port −ve envelope detector circuit 620, a second port +ve envelope detector circuit 630, a second port −ve envelope detector circuit 640, a +ve envelope differentiator circuit 650, a +ve envelope low pass filter 660, a −ve envelope differentiator circuit 670, a −ve envelope low pass filter 680 and a zero crossing detector 690 (step 1110). A radio frequency (RF) signal is received in the first port +ve envelope detector circuit 610 and in the second port +ve envelope detector circuit 630 and the detected +ve envelope signals are combined (step 1120). The +ve envelope signal is then provided to the +ve envelope differentiator circuit 650 and then to the +ve envelope low pass filter 660 (step 1130). The filtered +ve envelope signal from the +ve envelope low pass filter 660 is then provided to a first input of the zero crossing detector 690 (step 1140).

A radio frequency (RF) signal is received in the first port −ve envelope detector circuit 620 and in the second port −ve envelope detector circuit 640 and the detected −ve envelope signals are combined (step 1150). The −ve envelope signal is then provided to the −ve envelope differentiator circuit 670 and then to the −ve envelope low pass filter 680 (step 1160). The filtered −ve envelope signal from the −ve envelope low pass filter 680 is then provided to a second input of the zero crossing detector 690 (step 1170).

The zero crossing detector 690 detects a transition in the RF signal using the voltage difference between the +ve filtered differentiated envelope signal from the +ve envelope low pass filter 660 and the −ve filtered differentiated envelope signal from the −ve envelope low pass filter 680 (step 1180).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for demodulating radio frequency amplitude modulated signals, said method comprising the steps of:
providing a demodulator circuit that comprises a +ve envelope detector circuit, a first low pass filter having an input coupled to an output of said +ve envelope detector circuit, a second low pass filter having an input coupled to an output of said first low pass filter, and a latched comparator circuit having a first input coupled to an output of said first low pass filter and a second input coupled to an output of said second low pass filter;
receiving a radio frequency amplitude modulated signal in said +ve envelope detector circuit;
detecting a +ve envelope signal with said +ve envelope detector circuit;
providing said +ve envelope signal to a said first low pass filter;
filtering said +ve envelope signal with said first low pass filter; and
providing said filtered +ve envelope signal to said first input of said latched comparator circuit;
providing said filtered +ve envelope signal to said second low pass filter; and
creating a delayed version of said +ve envelope signal using said second low pass filter;
providing said delayed version of said +ve envelope signal to said second input of said latched comparator circuit; and
detecting in said latched comparator circuit a transition in said radio frequency amplitude modulated signal using a voltage difference between said +ve envelope signal from said first low pass filter and said delayed +ve envelope signal from said second low pass filter.

2. The method as set forth in claim 1 wherein said first low pass filter is a first order continuous low pass filter having a cutoff frequency of approximately five hundred thousand Hertz.

3. The method as set forth in claim 1 wherein said step of creating a delayed version of said +ve envelope signal using said second low pass filter comprises the step of:
selecting a value for an RC time constant of said second low pass filter.

4. A method for demodulating radio frequency amplitude modulated signals, said method comprising the steps of:
providing a demodulator circuit that comprises a +ve envelope detector circuit, a low pass filter having an input coupled to an output of said +ve envelope detector circuit, a reference voltage level unit, and a latched comparator circuit having a first input coupled to an output of said low pass filter and a second input coupled to an output of said reference voltage level unit;
receiving a radio frequency amplitude modulated signal in said +ve envelope detector circuit;
detecting a +ve envelope signal with said +ve envelope detector circuit;
providing said +ve envelope signal to a said first low pass filter;
filtering said +ve envelope signal with said first low pass filter; and
providing said filtered +ve envelope signal to a first input of said latched comparator circuit;
providing a reference voltage from said reference voltage level unit to said second input of said latched comparator circuit; and
detecting in said latched comparator circuit a transition in said radio frequency amplitude modulated signal layer using a voltage difference between said +ve envelope signal from said low pass filter and said reference voltage from said reference voltage level unit.

5. The method as set forth in claim 4 wherein said low pass filter is a first order continuous low pass filter having a cutoff frequency of approximately five hundred thousand Hertz.

6. A method for demodulating radio frequency amplitude modulated signals, said method comprising the steps of:
providing a first portion of a demodulator circuit that comprises a +ve envelope detector circuit, a first differentiator circuit having an input coupled to an output of said +ve envelope detector circuit, a first low pass filter having an input coupled to an output of said first differentiator circuit, and a zero crossing detector having a first input coupled to an output of said first low pass filter;
coupling in parallel to said first portion of said demodulator circuit a −ve envelope detector circuit, a second differentiator circuit having an input coupled to an output of said −ve envelope detector circuit, a second low pass filter having an input coupled to an output of said second differentiator circuit, wherein an output of said second low pass filter is coupled to a second input of said zero crossing detector;
receiving a radio frequency amplitude modulated signal in said +ve envelope detector circuit;
detecting a +ve envelope signal with said +ve envelope detector circuit; and
providing said +ve envelope signal to a said first differentiator circuit.

7. The method as set forth in claim 6 further comprising the steps of:
providing a +ve differentiated envelope signal from said first differentiator circuit to said first low pass filter;
filtering said +ve differentiated envelope signal with said first low pass filter; and
providing said +ve filtered differentiated envelope signal to said first input of said zero crossing detector.

8. The method as set forth in claim 7 further comprising the steps of:
receiving a radio frequency amplitude modulated signal in said −ve envelope detector circuit;
detecting a −ve envelope signal with said −ve envelope detector circuit;
providing said −ve envelope signal to a said second differentiator circuit;
providing a −ve differentiated envelope signal from said second differentiator circuit to said second low pass filter;
filtering said −ve differentiated envelope signal with said second low pass filter; and
providing said −ve filtered differentiated envelope signal to said second input of said zero crossing detector.

9. The method as set forth in claim 8 further comprising the step of:
detecting in said zero crossing detector a transition in said radio frequency amplitude modulated signal using a voltage difference between said +ve filtered differentiated envelope signal from said first low pass filter and said −ve filtered differentiated envelope signal from said second low pass filter.

10. The method as set forth in claim 9
wherein said first low pass filter is a first order continuous low pass filter having a cutoff frequency of approximately five hundred thousand Hertz; and
wherein said second low pass filter is a first order continuous low pass filter having a cutoff frequency of approximately five hundred thousand Hertz.

11. The method as set forth in claim 9 further comprising the step of:

detecting said transition in said zero crossing detector wherein said zero crossing detector has a minimum detection threshold level of twenty percent.

12. A method for demodulating radio frequency amplitude modulated signals in a demodulator that comprises a first input port and a second input port, said method comprising the steps of:

providing a demodulator circuit that comprises a first port +ve envelope detector circuit, a first port −ve envelope detector circuit, a second port +ve envelope detector circuit, and a second port −ve envelope detector circuit;

coupling together an output of said first port +ve envelope detector circuit and an output of said second port +ve envelope detector circuit;

coupling together an output of said first port −ve envelope detector circuit and an output of said second port −ve envelope detector circuit;

coupling to said output of said first port +ve envelope detector circuit and said second port +ve envelope detector circuit a +ve envelope differentiator circuit;

coupling an input of a +ve envelope low pass filter to an output of said +ve envelope differentiator circuit; and coupling a first input of a zero crossing detector to an output of said +ve envelope low pass filter.

13. The method as set forth in claim 12 further comprising the steps of:

receiving a radio frequency amplitude modulated signal in said first port +ve envelope detector circuit and in said second port +ve envelope detector circuit;

detecting a first port +ve envelope signal with said first port +ve envelope detector circuit;

detecting a second port +ve envelope signal with said second port +ve envelope detector circuit;

combining said first port +ve envelope signal with said second port +ve envelope signal to form a +ve envelope signal;

providing said +ve envelope signal to said +ve envelope differentiator circuit;

providing a +ve differentiated envelope signal from said +ve envelope differentiator circuit to said +ve envelope low pass filter;

filtering said +ve differentiated envelope signal with said +ve envelope low pass filter; and providing said +ve filtered differentiated envelope signal to said first input of said zero crossing detector.

14. The method as set forth in claim 13 further comprising the steps of:

coupling to said output of said first port −ve envelope detector circuit and said second port −ve envelope detector circuit a −ve envelope differentiator circuit;

coupling an input of a −ve envelope low pass filter to an output of said −ve envelope differentiator circuit; and coupling a second input of said zero crossing detector to an output of said −ve envelope low pass filter.

15. The method as set forth in claim 14 further comprising the steps of:

receiving a radio frequency amplitude modulated signal in said first port −ve envelope detector circuit and in said second port −ve envelope detector circuit;

detecting a first port −ve envelope signal with said first port −ve envelope detector circuit;

detecting a second port −ve envelope signal with said second port −ve envelope detector circuit;

combining said first port −ve envelope signal with said second port −ve envelope signal to form a −ve envelope signal;

providing said −ve envelope signal to said −ve envelope differentiator circuit;

providing a −ve differentiated envelope signal from said −ve envelope differentiator circuit to said −ve envelope low pass filter;

filtering said −ve differentiated envelope signal with said −ve envelope low pass filter; and providing said −ve filtered differentiated envelope signal to said second input of said zero crossing detector.

16. The method as set forth in claim 15 further comprising the step of:

detecting in said zero crossing detector a transition in said radio frequency amplitude modulated signal using a voltage difference between said +ve filtered differentiated envelope signal from said +ve envelope low pass filter and said −ve filtered differentiated envelope signal from said −ve envelope low pass filter.

17. The method as set forth in claim 16 further comprising the steps of:

placing a first RF limiter at an input to said first port +ve envelope detector circuit and to said first port −ve envelope detector circuit; and placing a second RF limiter at an input to said second port +ve envelope detector circuit and to said second port −ve envelope detector circuit.

18. The method as set forth in claim 9 further comprising the steps of:

receiving an RF signal in said demodulator circuit; and initializing a data high state within said demodulator circuit at a second stage of level shifting within said demodulator circuit.

19. The method as set forth in claim 13 wherein said +ve envelope low pass filter is a first order continuous low pass filter having a cutoff frequency of approximately five hundred thousand Hertz.

20. The method as set forth in claim 14 wherein said −ve envelope low pass filter is a first order continuous low pass filter having a cutoff frequency of approximately five hundred thousand Hertz.

* * * * *